United States Patent
Nomura

(10) Patent No.: US 6,713,865 B2
(45) Date of Patent: Mar. 30, 2004

(54) SEMICONDUCTOR DEVICE HAVING SEMICONDUCTOR ELEMENT HOUSED IN PACKED WITH HEAT SINK

(75) Inventor: Yukio Nomura, Yamagata (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/227,427

(22) Filed: Aug. 26, 2002

(65) Prior Publication Data
US 2003/0038362 A1 Feb. 27, 2003

(30) Foreign Application Priority Data
Aug. 27, 2001 (JP) .......................... 2001-255922

(51) Int. Cl.⁷ ............................... H01L 23/34
(52) U.S. Cl. .................. 257/712; 257/706; 257/730
(58) Field of Search ........................... 257/706, 712, 257/704, 701, 730

Primary Examiner—Roy Potter
(74) Attorney, Agent, or Firm—Sughrue Mion, PLLC

(57) ABSTRACT

A high power semiconductor device comprising a heat sink on which a semiconductor element is mounted, and a sidewall which is attached onto the heat sink and which surrounds the semiconductor element. One of the heat sink and the sidewall has a plurality of projections formed on a joining surface thereof to be joined to an opposing surface of the other one of the heat sink and the sidewall. A gap is formed by the projections between the sidewall and the heat sink when the sidewall is disposed on the heat sink. The sidewall and the heat sink are joined together by thermally curing low elasticity liquid resin which fills at least the gap formed by the projections between the sidewall and the heat sink. The projections are formed, for example, on the heat sink.

5 Claims, 4 Drawing Sheets

PRIOR ART

SEMICONDUCTOR DEVICE HAVING SEMICONDUCTOR ELEMENT HOUSED IN PACKED WITH HEAT SINK

FIELD OF THE INVENTION

The present invention relates generally to a semiconductor device, and more particularly to a semiconductor device in which semiconductor element or elements are housed in a package including a heat sink.

BACKGROUND OF THE INVENTION

FIG. 4 is a partially cutaway perspective view illustrating a conventional semiconductor device. The semiconductor device shown in FIG. 4 comprises a heat sink 41, and a semiconductor element 42 such as an integrated circuit device and the like mounted on the surface of the heat sink 41. The semiconductor device of FIG. 4 further comprises a sidewall 43 which is attached to the surface of the heat sink 41 and which surrounds the semiconductor element 42, and a cap not shown in the drawing which closes the opening portion of the sidewall 43 and covers the semiconductor element 42. In other words, the semiconductor element 42 is housed within a container having the heat sink 41, the sidewall 43 and the cap.

In the sidewall 43, a plurality of leads 44 are provided such that the leads 44 are partially buried in the sidewall 43 and penetrate the sidewall 43. One end of each of the leads 44 is coupled with a coupling pad 46 of the semiconductor element 42 via a bonding wire 45 and the like.

Fixing of the semiconductor element 42 to the heat sink 41, fixing of the sidewall 43 to the heat sink 41 and fixing of the cap to the sidewall 43 are respectively done by using thermosetting resin.

Japanese patent laid-open publication No. 11-238838 discloses another conventional semiconductor device. The semiconductor device disclosed in this publication has a similar structure to that of the semiconductor device shown in FIG. 4, except for the following. That is, the heat sink has projections at the peripheral portion thereof and the projections fit into concave portions formed in the sidewall, or the frame shaped sidewall is fit inside the projections formed in the heat sink. Thereby, an influence of the thermal expansion can be suppressed and disconnection of the bonding wires can be avoided.

According to the recent development in mobile communications, the size of a semiconductor device for use in a transmitter has become larger and larger, and an output power thereof has become higher and higher. Therefore, heat generation of such semiconductor device has become larger and larger. As a result, it is required that the package of the semiconductor device has far superior heat dissipating performance.

However, the conventional semiconductor devices mentioned above have a problem that, because of an increase in the size thereof and an increase in thermal expansion caused by an increase in heat generation, there arises a warp in the heat sink. Even in the semiconductor device disclosed in the Japanese patent laid-open publication No. 11-238838 in which thermal expansion of the frame member is suppressed by the heat sink, this problem arises when the size of such semiconductor device becomes large.

Also, the conventional semiconductor devices have a problem that, according to an increase in the size thereof and an increase in the thermal expansion caused by an increase in heat generation, an adhesive which joins the sidewall to the heat sink can not withstand the stress caused by the difference of thermal expansion between the sidewall and the heat sink, and junction between the sidewall and the heat sink becomes broken. Especially, this disjunction often occurs between the heat sink and the adhesive, because of the materials of the heat sink and the adhesive.

In the semiconductor device disclosed in the Japanese patent laid-open publication No. 11-238838 in which thermal expansion of the frame member is suppressed by the heat sink, gas which is produced when the adhesive is thermally cured and which causes voids can not escape effectively. Therefore, airtightness of the semiconductor package is deteriorated.

SUMMARY OF THE INVENTION

Therefore, it is an object of the present invention to provide a semiconductor device in which a warp in a heat sink does not occur even when a temperature of the semiconductor device has changed largely and thereby a high heat dissipating efficiency can be realized.

It is another object of the present invention to provide a semiconductor device in which junction between a heat sink and a sidewall of a semiconductor package is not broken even when a temperature of the semiconductor device has changed largely and thereby high airtightness can be maintained.

It is still another object of the present invention to provide a semiconductor device which has high reliability and uniform quality.

It is still another object of the present invention to obviate the disadvantages of the conventional semiconductor device having a heat sink.

According to an aspect of the present invention, there is provided a semiconductor device comprising: a heat sink on which a semiconductor element is mounted; a sidewall which is attached onto the heat sink and which surrounds the semiconductor element; wherein one of the heat sink and the sidewall has a plurality of projections formed on a joining surface thereof to be joined to an opposing surface of the other one of the heat sink and the sidewall; wherein a gap is formed by the projections between the sidewall and the heat sink when the sidewall is disposed on the heat sink; and wherein the sidewall and the heat sink are joined together by using low elasticity liquid resin which fills at least the gap formed by the projections between the sidewall and the heat sink.

In this case, it is preferable that the projections are formed on the heat sink.

It is also preferable that each of the projections have a height of 200 µm or larger.

It is further preferable that the low elasticity liquid resin is thermosetting epoxy resin, and the sidewall and the heat sink are joined by thermally curing the low elasticity liquid resin.

It is advantageous that the modulus of elasticity of the low elasticity liquid resin becomes 1000 kgf/mm² or smaller after thermally curing the low elasticity liquid resin.

According to another aspect of the present invention, there is procided a method of manufacturing a semiconductor device having a heat sink on which a semiconductor element is mounted and a sidewall which is attached onto the heat sink and which surrounds the semiconductor element, the method comprising: forming a plurality of projections on a joining surface of one of the heat sink and the sidewall, the joining surface is a surface to be joined to an opposing surface of the other one of the heat sink and the sidewall; disposing the sidewall on the heat sink; filling a gap formed by the projections between the heat sink and the sidewall with low elasticity liquid resin; and joining the heat sink and the sidewall by curing the low elasticity liquid resin.

In this case, it is preferable that the low elasticity liquid resin is cured in the condition the sidewall is pressed onto the heat sink.

It is also preferable that the projections are formed on the heat sink.

It is further preferable that the low elasticity liquid resin is thermosetting epoxy resin, and the sidewall and the heat sink are joined by thermally curing the low elasticity liquid resin.

It is advantageous that the modulus of elasticity of the low elasticity liquid resin becomes 1000 kgf/mm$^2$ or smaller after thermally curing the low elasticity liquid resin.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, an embodiment of the present invention will now be described in detail.

Figure 1:
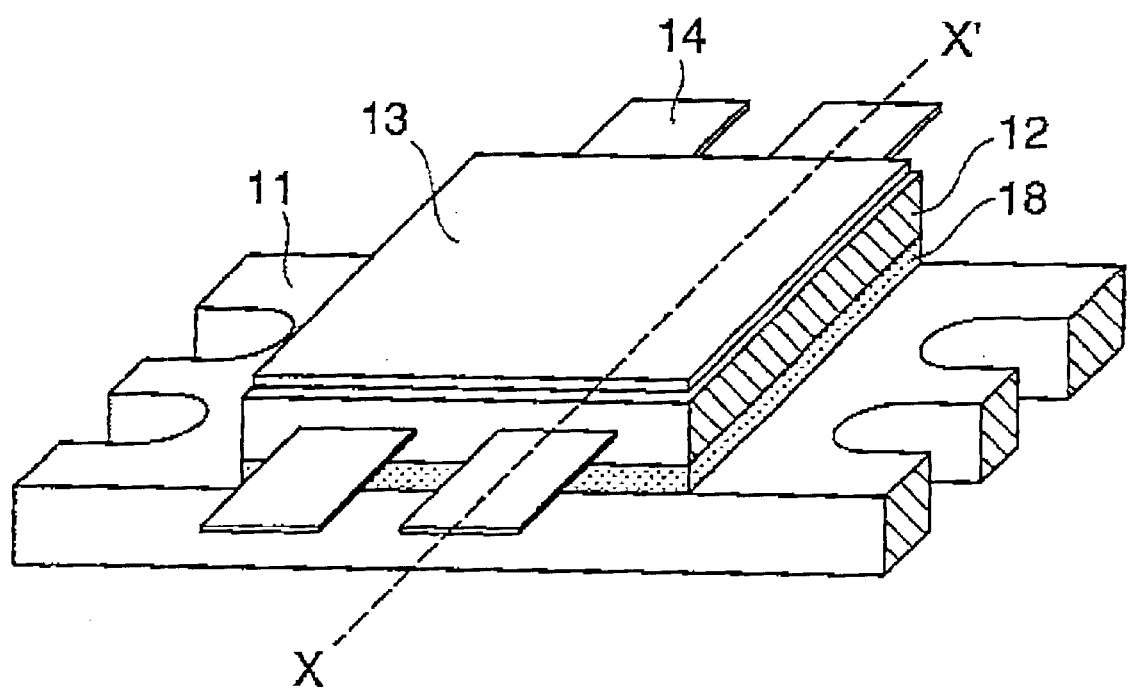
FIG. 1 is a perspective view showing a semiconductor device according an embodiment of the present invention.
Figure 2:
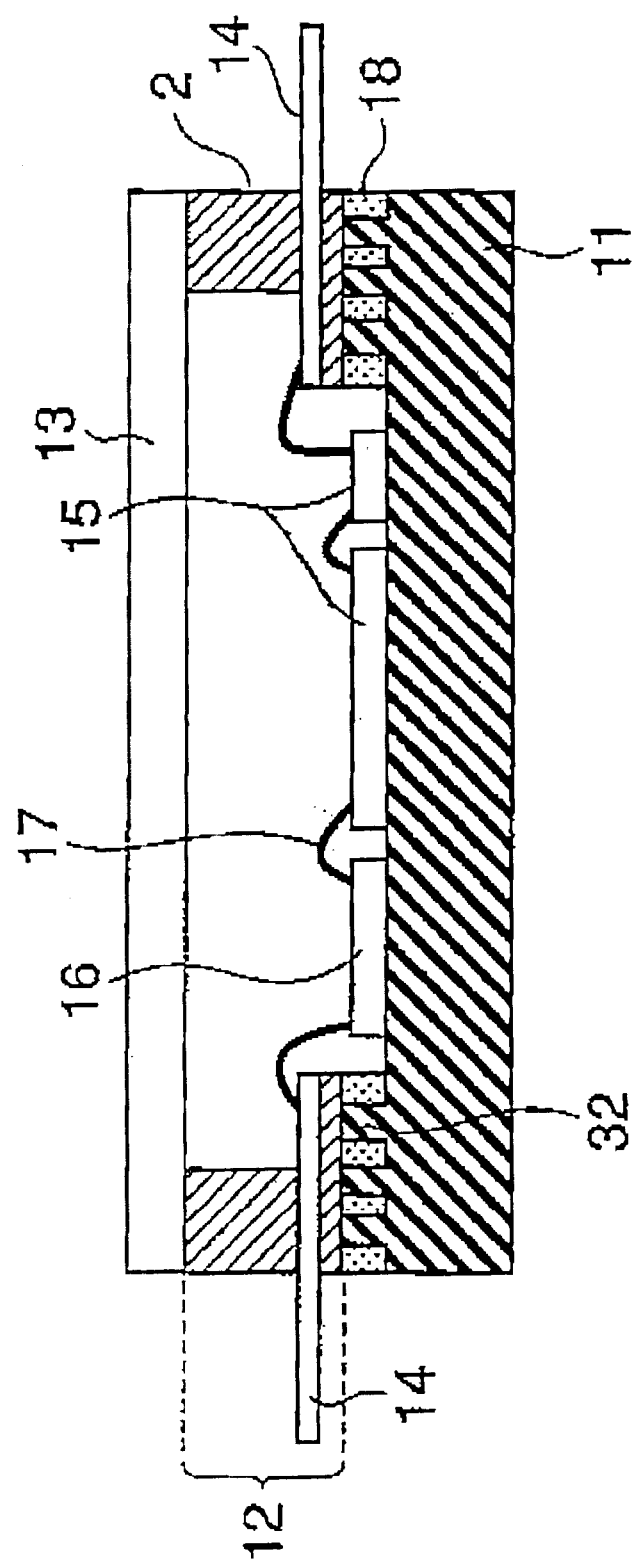
FIG. 2 is a cross sectional view taken along the line X–X' of FIG. 1.
Figure 3:
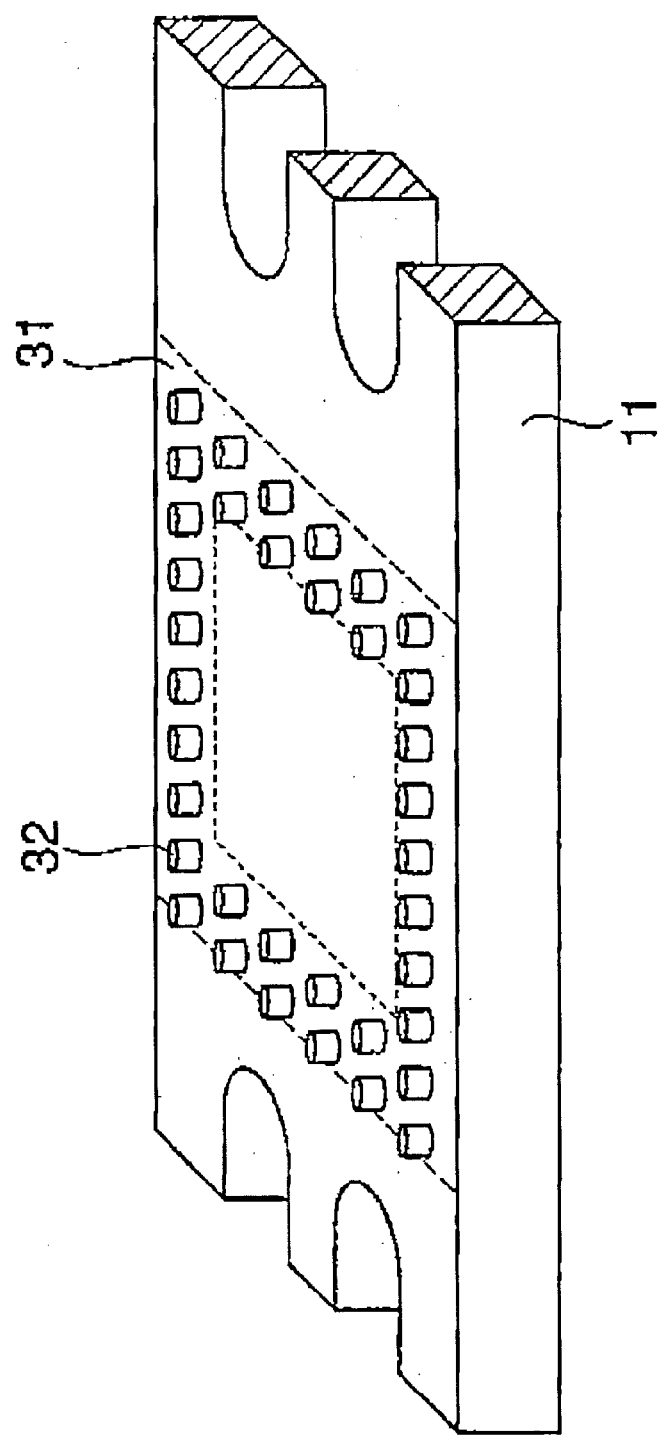
FIG. 3 is a perspective view showing a heat sink used in the semiconductor device of FIG. 1.
Figure 4:
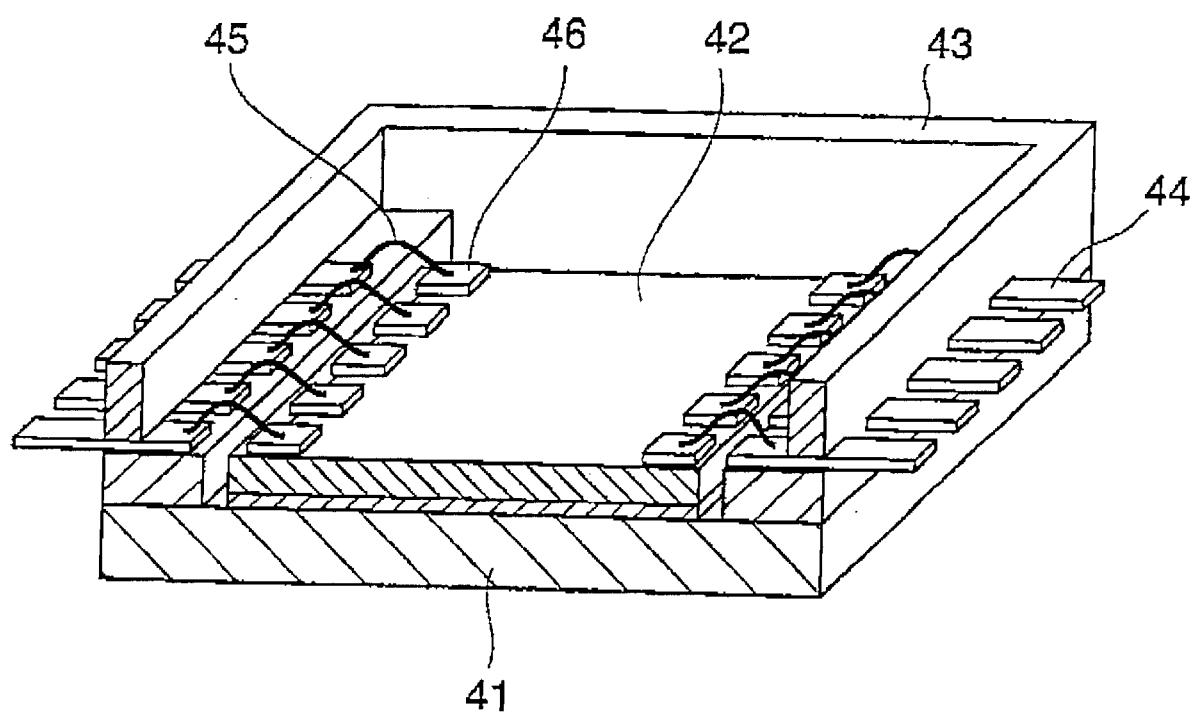
FIG. 4 is a partially cutaway perspective view illustrating a conventional semiconductor device.

FIG. 1 to FIG. 3 illustrate a high power semiconductor device according to an embodiment of the present invention. Here, FIG. 1 is a perspective view showing a semiconductor device according an embodiment of the present invention. FIG. 2 is a cross sectional view taken along the line X–X' of FIG. 1. FIG. 3 is a perspective view showing a heat sink used in the semiconductor device of FIG. 1.

As shown in FIG. 1 and FIG. 2, the semiconductor device according to the present invention comprises a heat sink 11, a sidewall 12 and a cap 13. In the sidewall 12, a plurality of leads 14 are provided such that the leads 14 are partially buried in the sidewall 12 and penetrate the sidewall 12. One end of each of the leads 14 is coupled with a semiconductor element 15, a matching circuit substrate 16 and the like mounted on the heat sink 11 via bonding wires 17 and the like. Also, there are provided a resin layer 18 between the heat sink 11 and the sidewall 12 which joins the heat sink 11 and the sidewall 12 together.

The heat sink 11 is made, for example, of copper, copper alloy, copper or copper alloy cladded material and the like which has superior heat dissipation and workability, and is fabricated by using, for example, presswork and the like. As shown in FIG. 3, on the surface of the heat sink 11, there are provided a plurality of projections 32 in a joining surface portion 31 on which the sidewall 12 is joined. Each of the projections 32 has, for example, a diameter of 200 μm through 1000 μm, and a height of 200 μm through 1000 μm. Number of the projections 32 and the like are appropriately determined depending on sizes of the device, an area of the joined surface portion 31, modulus of elasticity of low elasticity liquid resin for making the resin layer 18, and the like.

The sidewall 12 comprises a sidewall member 2 and leads 14. The sidewall member 2 is made of ceramic such as alumina and the like on which a metal film of tungsten and the like is formed. The leads 14 are inserted into penetrating holes formed in the sidewall member 2, and are fixed to the sidewall member 2 by using silver-copper solder and the like. The sidewall 12 is disposed on the projections 32 and is joined to the heat sink 11 by using the resin layer 18.

The cap 13 is made, for example, of ceramic, resin or metal. After mounting the semiconductor element 15 and the like on the heat sink 11, the cap 13 is joined onto the opening portion of the sidewall 12 to encapsulate the semiconductor element 15 and the like.

The semiconductor element 15 and the matching circuit board 16 are only examples of element and circuit mounted on the heat sink 11 and do not directly relate to the structure of the present invention. The circuit(s) and/or element(s) monuted on the heat sink 11 may be any suitable circuit, element and the like. These semiconductor element 15 and the matching circuit board 16 are joined to the heat sink 11 by using, for example, gold-tin alloy, electrically conductive resin and the like. Also, these semiconductor element 15 and the matching circuit board 16 are electrically coupled to each other and to the leads 14 via wires 14 made of gold and the like.

The resin layer 18 is formed by thermally curing low elasticity liquid resin which is thermally curable, for example, thermally curable epoxy resin. When the low elasticity liquid resin is thermally cured, the sidewall 12 is pressed onto the heat sink 11 and, thereby, it is possible to make the thickness of the resin layer 18 equal to the height of the projections 32. The low elasticity liquid resin may be previously applied, for example, onto the heat sink 11 before attaching the sidewall 12 onto the heat sink 11, or the low elasticity liquid resin may be injected into the gap between the sidewall 12 and the heat sink 11 after disposing the sidewall 12 onto the heat sink 11.

Next, an explanation will be made on an operation and the like of the semiconductor device having the structure mentioned above.

The semiconductor device mentioned above is attached to a mounting base not shown in the drawing by, for example, screwing. The more tightly the heat sink 11 and the mounting base adheres to each other, the higher the heat dissipating efficiency becomes.

Heat generated by an operation of the semiconductor device 15 is dissipated to the mounting base via the heat sink 11. Also, the heat generated by the semiconductor device 15 is conducted to the sidewall 12 directly by radiation and via the heat sink 11. When thermal expansion coefficients differ between the heat sink 11 and the sidewall 12, there occurs a difference in thermal expansions between the heat sink 11 and the sidewall 12. In this case, the resin layer 18 functions as a buffering member between the heat sink 11 and the sidewall 12, and suppresses occurrence of a warp in the heat sink 11. As a result, it is possible to maintain tight adhesion between the heat sink 11 and the mounting base and thereby to realize a heat dissipation efficiency higher than that of the conventional semiconductor device.

By providing the projections 32, it is possible to increase the junction area between the heat sink 11 and the resin layer 18, and to raise the junction strength therebetween. As a result, it is possible to avoid delamination between the heat sink 11 and the resin layer 18 caused by heat expansion. That is, the projections 32 functions as anchor, and avoids separation of the junction between the resin layer 18 and the heat sink 11 caused by heat expansion.

The larger the thickness of the resin layer 18, the larger the buffering effect (stress mitigating effect) of the resin layer 18. The projections 32 are used for obtaining an enough thickness of the resin layer 18. That is, when fabricating the semiconductor device, the resin layer 18 is thermally cured in a condition the sidewall 12 is pressed onto the heat sink 11 with predetermined force, that is, in a condition the sidewall 12 and the projections 32 are in close contact with each other. Thereby, it becomes possible to make the thickness of the resin layer 18 equal to the height of the projections 32. In this way, it is possible to avoid occurrence of variation or dispersion of the thickness of the resin layer 18 when the semiconductor devices are mass-produced. It is preferable that the thickness of the resin layer 18 is 200 μm or larger to obtain sufficient buffering effect.

Also, the lower the modulus of elasticity of the resin layer 18, the larger the buffering effect of the resin layer 18. In order to suppress a warp in the heat sink 11, it is preferable that the modulus of elasticity (after curing) of the heat sink 11 is 1000 kgf/mm$^2$ or smaller. The modulus of elasticity of the resin layer 18 can be changed by controlling the amount of filler, for example, by changing the amount of addition of filler of glass and the like.

In the above, a preferred embodiment of the present invention is explained. However, the present invention is not limited to such embodiment. For example, the sidewall 12 may be made by using the sidewall member made of mold resin, and the leads 14. In such case, the sidewall 12 can be fabricated by transfer molding method, and it is possible to lower the cost of the semiconductor device.

Also, in the above-mentioned embodiment, the projections are provided on the heat sink. However, for example, when the adhesive strength between the sidewall and the adhesive is weaker than that between the heat sink and the adhesive, it is also possible to provide projections on the side of the sidewall.

As mentioned above, according to the present invention, projections are provided at the joining surface of the heat sink or the sidewall to form a gap therebetween, and the heat sink and the sidewall are joined to each other by filling low elasticity liquid resin into the gap. Thereby, it is possible to avoid occurrence of a warp in the heat sink caused by heat expansion. As a result, it is possible to realize a semiconductor device having a high heat dissipating efficiency.

Also, by using the structure according to the present invention, it is possible to avoid delamination between the heat sink and the sidewall and to avoid occurrence of voids in the resin layer. Therefore, it becomes possible to maintain high airtightness of the semiconductor device.

Further, by using the structure according to the present invention, it is possible to suppress variation or dispersion of a film thickness of the low elasticity liquid resin when the semiconductor device is mass-produced.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A semiconductor device comprising:
   a heat sink on which a semiconductor element is mounted;
   a sidewall which is attached onto the heat sink and which surrounds the semiconductor element;
   wherein one of the heat sink and the sidewall has a plurality of projections formed on a joining surface thereof to be joined to an opposing surface of the other one of the heat sink and the sidewall;
   wherein a gap is formed by the projections between the sidewall and the heat sink when the sidewall is disposed on the heat sink; and
   wherein the sidewall and the heat sink are joined together by using low elasticity liquid resin which fills at least the gap formed by the projections between the sidewall and the heat sink.

2. A semiconductor device as set forth in claim 1, wherein the projections are formed on the heat sink.

3. A semiconductor device as set forth in claim 1, wherein each of the projections have a height of 200 μm or larger.

4. A semiconductor device as set forth in claim 1, wherein the low elasticity liquid resin is thermosetting epoxy resin, and the sidewall and the heat sink are joined by thermally curing the low elasticity liquid resin.

5. A semiconductor device as set forth in claim 1, wherein the modulus of elasticity of the low elasticity liquid resin becomes 1000 kgf/mm$^2$ or smaller after thermally curing the low elasticity liquid resin.

* * * * *